United States Patent
Park et al.

(10) Patent No.: US 9,526,174 B2
(45) Date of Patent: Dec. 20, 2016

(54) MULTILAYER CERAMIC ELECTRONIC COMPONENT AND BOARD HAVING THE SAME MOUNTED THEREON

(71) Applicant: SAMSUNG ELECTRO-MECHANICS CO., LTD., Suwon-Si, Gyeonggi-Do (KR)

(72) Inventors: Sang Soo Park, Suwon-Si (KR); Min Cheol Park, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 222 days.

(21) Appl. No.: 14/199,695

(22) Filed: Mar. 6, 2014

(65) Prior Publication Data

US 2015/0131252 A1     May 14, 2015

(30) Foreign Application Priority Data

Nov. 14, 2013 (KR) .................. 10-2013-0138631

(51) Int. Cl.
    *H01G 4/30*     (2006.01)
    *H05K 1/18*     (2006.01)
    (Continued)

(52) U.S. Cl.
    CPC .............. *H05K 1/181* (2013.01); *H01G 2/065* (2013.01); *H01G 4/012* (2013.01); *H01G 4/232* (2013.01);
    (Continued)

(58) Field of Classification Search
    CPC .......... H01G 4/30; H01G 4/005; H01G 4/002; H01G 4/228; H01G 4/232; H01G 4/236; H01G 4/06; H01G 4/018; H01G 4/08; H01G 4/12; H01G 4/1209
    (Continued)

(56) References Cited

U.S. PATENT DOCUMENTS

2003/0057470 A1    3/2003   Taniguchi et al.
2004/0066589 A1*   4/2004   Togashi ................ H01G 2/065
                                         361/15

(Continued)

FOREIGN PATENT DOCUMENTS

JP    59-101425 U    7/1984
JP    07-111380 A    4/1995
(Continued)

OTHER PUBLICATIONS

Korean Office Action in corresponding Korean Patent Application No. 10-2013-0138631 issued on Oct. 7, 2014.

(Continued)

*Primary Examiner* — Binh Tran
(74) *Attorney, Agent, or Firm* — McDermott Will & Emery LLP

(57) ABSTRACT

A multilayer ceramic electronic component may include: a multilayer ceramic capacitor including a ceramic body, a plurality of first and second internal electrodes formed to be alternately exposed to both side surfaces of the ceramic body, having a dielectric layer therebetween, and first and second external electrodes connected to the first and second internal electrodes, respectively; and an interposer board including an insulation board coupled to the mounting surface of the multilayer ceramic capacitor and first and second connection terminals formed on the insulation board and connected to the first and second external electrodes, respectively.

22 Claims, 5 Drawing Sheets

(51) Int. Cl.
*H01G 2/06* (2006.01)
*H01G 4/012* (2006.01)
*H01G 4/232* (2006.01)
*H01G 4/228* (2006.01)
*H01G 4/236* (2006.01)
*H01G 4/06* (2006.01)
*H01G 4/018* (2006.01)
*H01G 4/005* (2006.01)
*H01G 4/08* (2006.01)
*H01G 4/12* (2006.01)

(52) U.S. Cl.
CPC .............. *H01G 4/30* (2013.01); *H01G 4/005* (2013.01); *H01G 4/018* (2013.01); *H01G 4/08* (2013.01); *H01G 4/12* (2013.01); *H01G 4/228* (2013.01); *H01G 4/236* (2013.01); *H05K 2201/10015* (2013.01); *H05K 2201/10378* (2013.01); *Y02P 70/611* (2015.11)

(58) Field of Classification Search
USPC ............... 361/301.4, 303, 306.1, 306.3, 307, 308.1, 361/311–313, 321.1, 321.2
See application file for complete search history.

(56) References Cited

U.S. PATENT DOCUMENTS

| | | | |
|---|---|---|---|
| 2007/0025053 A1* | 2/2007 | Takahashi | H01G 4/012 361/303 |
| 2009/0154055 A1 | 6/2009 | Takashima et al. | |
| 2011/0180317 A1 | 7/2011 | Takahashi et al. | |
| 2013/0284507 A1* | 10/2013 | Hattori | H05K 1/18 174/260 |
| 2013/0319741 A1 | 12/2013 | Ahn et al. | |
| 2014/0016242 A1 | 1/2014 | Hattori et al. | |

FOREIGN PATENT DOCUMENTS

| | | |
|---|---|---|
| JP | 2003-086927 A | 3/2003 |
| JP | 2004-087717 A | 3/2004 |
| JP | 2004-134430 A | 4/2004 |
| JP | 2007-103496 A | 4/2007 |
| JP | 2007-194312 A | 8/2007 |
| JP | 2009-170873 A | 7/2009 |
| JP | 5012658 B2 | 8/2012 |
| JP | 2012-204572 A | 10/2012 |
| JP | 2013-089705 A | 5/2013 |
| JP | 5319007 B1 | 10/2013 |
| KR | 10-2011-0043780 A | 4/2011 |
| WO | 2012/090986 A1 | 7/2012 |

OTHER PUBLICATIONS

Japanese Office Action dated Aug. 25, 2015 issued in Japanese Patent Application No. 2014-041778 (English translation).
Japanese Office Action dated May 24, 2016 issued in Japanese Patent Application No. 2014-041778 (English translation).
Japanese Office Action dated Aug. 25, 2015 issued in Japanese Patent Application No. 2014-041778.

* cited by examiner

MULTILAYER CERAMIC ELECTRONIC COMPONENT AND BOARD HAVING THE SAME MOUNTED THEREON

CROSS-REFERENCE TO RELATED APPLICATION

This application claims the benefit of Korean Patent Application No. 10-2013-0138631 filed on Nov. 14, 2013, with the Korean Intellectual Property Office, the disclosure of which is incorporated herein by reference.

BACKGROUND

The present disclosure relates to a multilayer ceramic electronic component and a board having the same mounted thereon.

A multilayer ceramic capacitor, which is one of multilayer chip electronic components, is a chip-shaped condenser mounted on circuit boards of various electronic products such as a display device, for example, a liquid crystal display (LCD), a plasma display panel (PDP), or the like, a computer, a personal digital assistant (PDA), a mobile phone, and the like, to serve to charge or discharge electricity.

Since this multilayer ceramic capacitor (MLCC) has advantages such as a small size, high capacitance, ease of mounting, and the like, the multilayer ceramic capacitor may be used as a component of various electronic devices.

The multilayer ceramic capacitor may have a structure in which a plurality of dielectric layers and internal electrodes having different polarities between the dielectric layers are alternately stacked.

Since the dielectric layer as described above has piezoelectricity and electrostriction, when direct current (DC) voltage or alternate current (AC) voltage is applied to the multilayer ceramic capacitor, a piezoelectric phenomenon may be generated between the internal electrodes to cause vibration.

This vibration is transferred to a circuit board on which the multilayer ceramic capacitor is mounted through an external electrode of the multilayer ceramic capacitor, such that the entire circuit board becomes an acoustic reflective surface generating a vibration sound that becomes noise.

The vibration sound may have a frequency corresponding to an audio frequency in a region between 20 Hz to 20,000 Hz, known to make a person uncomfortable. The vibration sound making the person uncomfortable as described above is referred to as acoustic noise.

SUMMARY

An aspect of the present disclosure may provide a multilayer ceramic capacitor capable of decreasing acoustic noise.

According to an aspect of the present disclosure, a multilayer ceramic electronic component may include: a multilayer ceramic capacitor including a ceramic body in which a plurality of dielectric layers are stacked, a plurality of first and second internal electrodes formed to be alternately exposed to both side surfaces of the ceramic body, having the dielectric layer therebetween, and first and second external electrodes formed to be extended from both side surfaces of the ceramic body to portions of a mounting surface of the ceramic body and connected to the first and second internal electrodes, respectively; and an interposer board including an insulation board coupled to the mounting surface of the multilayer ceramic capacitor and first and second connection terminals formed on the insulation board and connected to the first and second external electrodes, respectively.

The first and second connection terminals of the interposer board may include: first and second terminal parts formed to cover both end portions of the insulation board; first and second interconnection parts extended inwardly from the first and second terminal parts along an upper surface of the insulation board; and first and second connection parts connected to end portions of the first and second interconnection parts and connected to the first and second external electrodes, respectively.

The first and second terminal parts of the first and second connection terminals may include: a conductive conduction layer formed on a surface of the insulation board; and a conductive resin layer formed to cover the conductive conduction layer.

The first and second connection terminals may include a conductive adhesive layer formed on the first and second connection parts.

The conductive adhesive layer may contain a conductive resin or be formed of a high melting point solder.

The first and second connection terminals may include a plating layer formed on the first and second terminal parts.

In the plating layer of the first and second terminal parts, a nickel plating layer and a gold plating layer may be sequentially formed.

The multilayer ceramic capacitor may include a plating layer formed on the first and second external electrodes.

In the multilayer ceramic capacitor, the first and second external electrodes may be formed to be extended from both side surfaces of the ceramic body to portions of an upper surface of the ceramic body.

In the multilayer ceramic capacitor, the first and second external electrodes may be formed on central portions of both side surfaces of the ceramic body.

The multilayer ceramic capacitor may include upper and lower cover layers formed on upper and lower surfaces of the ceramic body.

The lower cover layer may be formed to be thicker than the upper cover layer.

The interposer board may be formed to have an area smaller than that of the mounting surface of the multilayer ceramic capacitor.

According to another aspect of the present disclosure, a board having a multilayer ceramic electronic component mounted thereon may include: a board having first and second electrode pads formed thereon; and a multilayer ceramic electronic component mounted on the board, wherein the multilayer ceramic electronic component includes: a multilayer ceramic capacitor including a ceramic body in which a plurality of dielectric layers are stacked, a plurality of first and second internal electrodes formed to be alternately exposed to both side surfaces of the ceramic body, having the dielectric layer interposed therebetween, and first and second external electrodes formed to be extended from both side surfaces of the ceramic body to portions of a mounting surface of the ceramic body and connected to the first and second internal electrodes, respectively; and an interposer board including an insulation board coupled to the mounting surface of the multilayer ceramic capacitor and first and second connection terminals formed on the insulation board and having an upper surface connected to the first and second external electrodes, respectively, and a lower surface connected to the first and second electrode pads, respectively.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
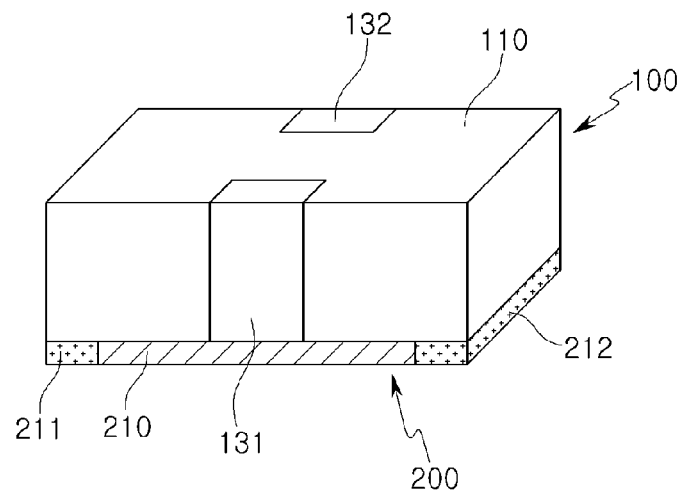
FIG. 1 is a perspective view illustrating a multilayer ceramic electronic component according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe the exemplary embodiments of the present disclosure. A direction in which an external electrode is formed is referred to as a width direction, a direction intersecting with the width direction is referred to as a length direction, and a direction in which a dielectric layer is stacked is referred to as a thickness direction or a stacked direction.

Further, in this exemplary embodiment, for convenience of explanation, surfaces of a ceramic body opposing each other in the thickness direction may be defined as upper and lower surfaces, surfaces thereof opposing each other in the length direction may be defined as both end surfaces, and surfaces opposing each other while vertically intersecting the surfaces in the length direction may be defined as both side surfaces. Here, the lower surface may be defined as a mounting surface.

Multilayer Ceramic Electronic Component

Figure 2:
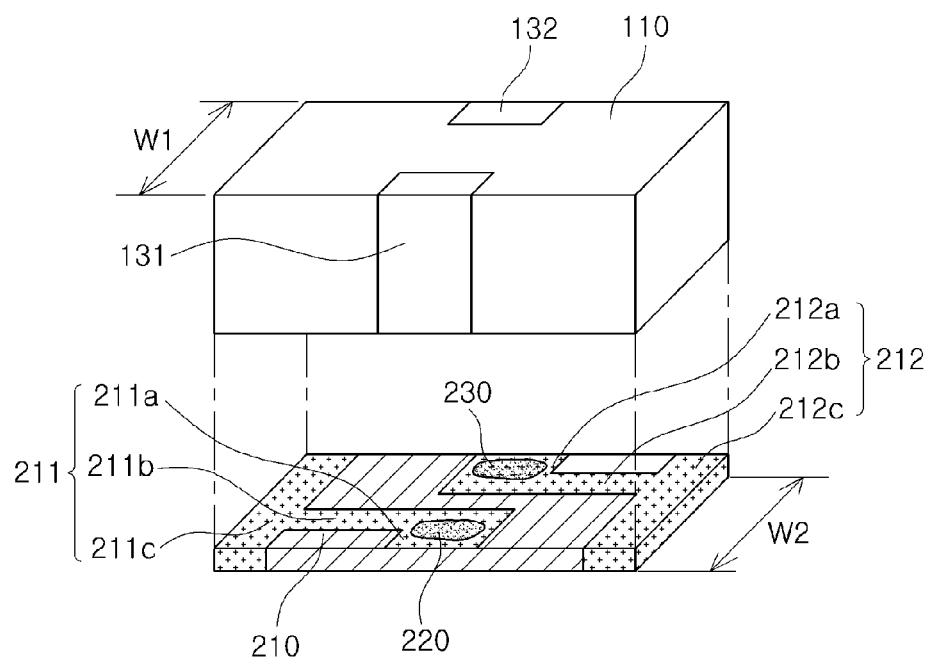
FIG. 2 is an exploded perspective view illustrating the multilayer ceramic electronic component of FIG. 1 in a state in which it is divided into a multilayer ceramic capacitor and an interposer board.
Figure 3A:
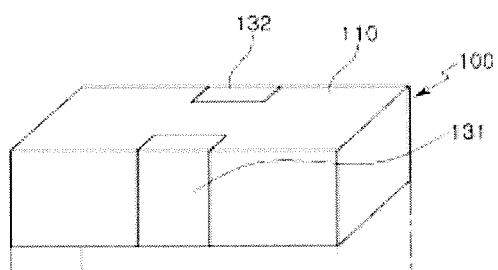
FIGS. 3A through 3C are perspective views illustrating a manufacturing process of the multilayer ceramic electronic component according to the exemplary embodiment of the present disclosure.
Figure 3B:
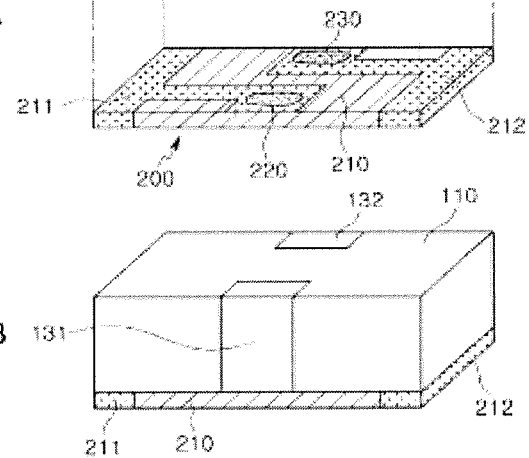
Figure 3C:
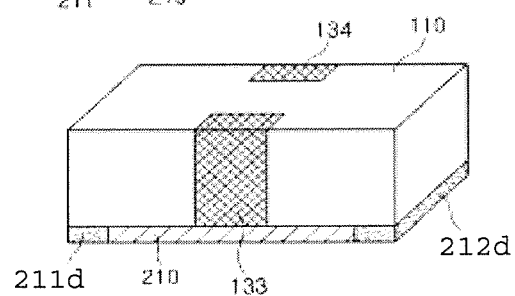
Figure 4:
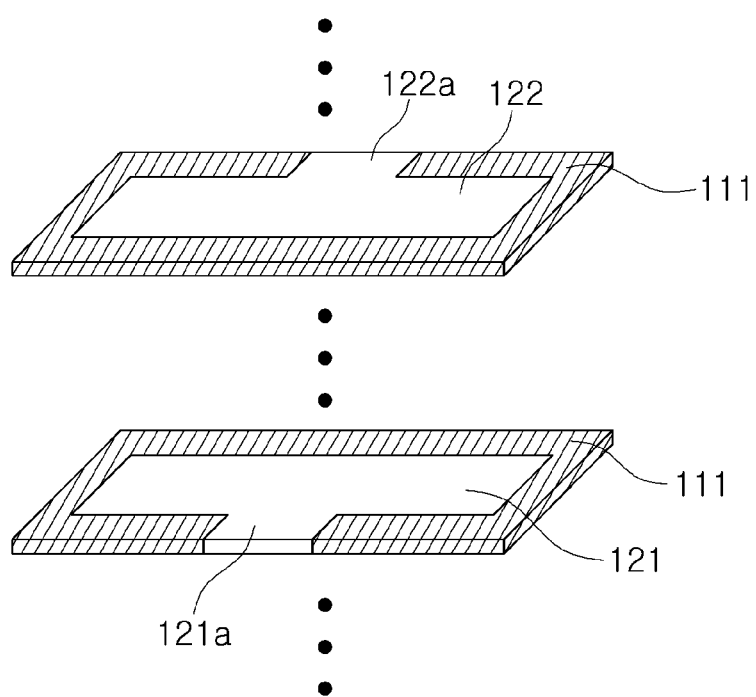
FIG. 4 is an exploded perspective view illustrating a structure of an internal electrode of the multilayer ceramic capacitor of the multilayer ceramic electronic component of FIG. 1.

FIG. 1 is a perspective view illustrating a multilayer ceramic electronic component according to an exemplary embodiment of the present disclosure; FIG. 2 is an exploded perspective view illustrating the multilayer ceramic electronic component of FIG. 1 in a state in which it is divided into a multilayer ceramic capacitor and an interposer board; FIGS. 3A through 3C are perspective views illustrating a manufacturing process of the multilayer ceramic electronic component according to the exemplary embodiment of the present disclosure; and FIG. 4 is an exploded perspective view illustrating a structure of an internal electrode of the multilayer ceramic capacitor of the multilayer ceramic electronic component of FIG. 1.

Referring to FIGS. 1 through 4, the multilayer ceramic electronic component according to an exemplary embodiment of the present disclosure may include a multilayer ceramic capacitor 100 and an interposer board 200 including an insulation board 210 coupled to a mounting surface of the multilayer ceramic capacitor 100 and first and second connection terminals 211 and 212 formed on the insulation board 210 and connected to first and second external electrodes 131 and 132 of the multilayer ceramic capacitor 100, respectively.

Here, the interposer board may refer to a sheet or plate shaped member enabling a fan-out or pad pitch expansion.

That is, the interposer board may substantially indicate a board for changing a pitch of an electrode terminal used at the time of mounting an electronic component on a circuit board. The electronic component and the mounting board may be electrically connected to each other by the interposer board as described above.

Hereinafter, the multilayer ceramic capacitor 100 applied to this exemplary embodiment will be described in detail.

The multilayer ceramic capacitor 100 according to this exemplary embodiment may include a ceramic body 110, a plurality of first and second internal electrodes 121 and 122, and the first and second external electrodes 131 and 132 formed to be extended from both side surfaces of the ceramic body 110 to portions of a lower surface of the ceramic body 110, which is a mounting surface.

In this exemplary embodiment, the first and second external electrodes 131 and 132 may be formed on portions of both side surfaces of the ceramic body 110, such that an area of solder contacting the external electrode at the time of mounting may be minimized, and a formation height of the solder may be accordingly minimized.

The ceramic body 110 may be formed by stacking and then sintering a plurality of dielectric layers 111. In this case, a shape and a dimension of the ceramic body 110 and the number of stacked dielectric layers 111 are not limited to those illustrated in the accompanying drawings of this exemplary embodiment.

In addition, the plurality of dielectric layers 111 configuring the ceramic body 110 may be in a sintered state. Adjacent dielectric layers 111 may be integrated such that it is difficult to confirm a boundary therebetween without using a scanning electron microscope (SEM).

The ceramic body 110 as described above may be configured of an active layer as a part contributing to forming capacitance of the capacitor and upper and lower cover layers formed on the upper and lower portions of the active layer, respectively, as upper and lower margin parts.

The upper and lower cover layers may have the same material and configuration as those of the dielectric layer 111, except that the internal electrodes are not included therein.

In addition, the upper and lower cover layers may be formed by stacking a single or two or more dielectric layers on upper and lower surfaces of the active layer in the thickness direction, and may serve to prevent the first and second internal electrodes 121 and 122 from being damaged by physical or chemical stress.

In this case, when the lower cover layer is formed to be thicker than the upper cover layer, acoustic noise may be further decreased.

The active layer may be formed by repeatedly stacking the plurality of first and second internal electrodes 121 and 122 so as to be alternately exposed to both side surfaces of the ceramic body 110, having the dielectric layer 111 interposed therebetween.

In this case, a thickness of the dielectric layer 111 may be arbitrarily changed according to the capacitance design of the multilayer ceramic capacitor 100, and a thickness of a single layer may preferably be from 0.01 µm to 1.00 µm after sintering; however, the present disclosure is not limited thereto.

Further, the dielectric layer 111 may contain ceramic powder having high permittivity, for example, barium titanate ($BaTiO_3$) based powder or strontium titanate ($SrTiO_3$) based powder, or the like, but the present disclosure is not limited thereto.

The first and second internal electrodes 121 and 122, which are electrodes having polarities different from each other, may be formed by printing a conductive paste containing a conductive metal on the dielectric layer 111 at a predetermined thickness so as to be alternately exposed to both side surfaces in the stacked direction of the dielectric layer 111, and may be electrically insulated from each other by the dielectric layer 111 disposed therebetween.

The first and second internal electrodes 121 and 122 as described above may be electrically connected to first and second external electrodes 131 and 132 formed on both side surfaces of the ceramic body 110, respectively, through lead parts 121a and 122a exposed to the side surface of the ceramic body 110.

Therefore, when voltage is applied to the first and second external electrodes 131 and 132, electric charges are accumulated between the first and second internal electrodes 121 and 122 facing each other. In this case, capacitance of the multilayer ceramic capacitor 100 may be proportional to an area of an overlapped region between the first and second internal electrodes 121 and 122 in the active layer.

A thickness of the first and second internal electrodes 121 and 122 as described above may be determined according to the use thereof. For example, the thickness may be determined to be in a range of 0.2 µm to 1.0 µm considering a size of the ceramic body 110, but the present disclosure is not limited thereto.

Further, the conductive metal included in the conductive paste forming the first and second internal electrodes 121 and 122 may be nickel (Ni), copper (Cu), palladium (Pd), or an alloy thereof, but the present disclosure is not limited thereto.

Further, as a printing method of the conductive paste, a screen printing method, a gravure printing method, or the like, may be used, but the present disclosure is not limited thereto.

Meanwhile, the first and second external electrodes 131 and 132 may be formed of a conductive paste including a conductive metal, wherein the conductive metal may be nickel (Ni), copper (Cu), palladium (Pd), gold (Au), or an alloy thereof, but the present disclosure is not limited thereto.

In addition, the first and second external electrodes 131 and 132 may be formed on central portions of both side surfaces of the ceramic body 110.

The first and second external electrodes 131 and 132 may absorb mechanical stress from the outside, or the like, thereby preventing damage such as cracks, or the like, from occurring in the ceramic body 110 and the first and second internal electrodes 121 and 122.

In this case, plating layers 133 and 134 may be formed on surfaces of the first and second external electrodes 131 and 132 as needed. The plating may be performed using copper, nickel, gold, or the like, but the present disclosure is not limited thereto.

In addition, the first and second external electrodes 131 and 132 may be formed to be extended from both side surfaces of the ceramic body 110 to portions of the upper surface of the ceramic body 110.

Therefore, the multilayer ceramic capacitor 100 may have a vertically symmetric structure, such that vertical directionality at the time of mounting the multilayer ceramic capacitor 100 may be eliminated.

Interposer Board

Figure 5A:
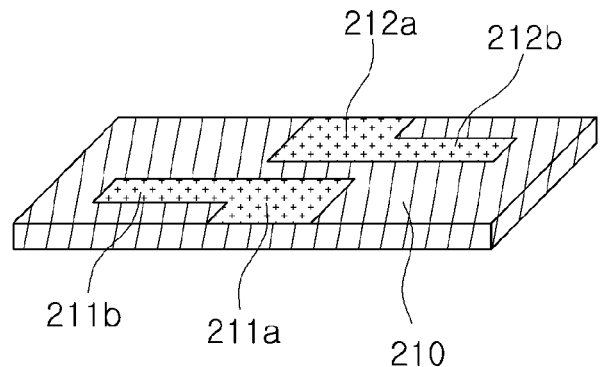
FIGS. 5A through 5C are perspective views illustrating a manufacturing process of the interposer board of the multilayer ceramic electronic component of FIG. 1.
Figure 5B:
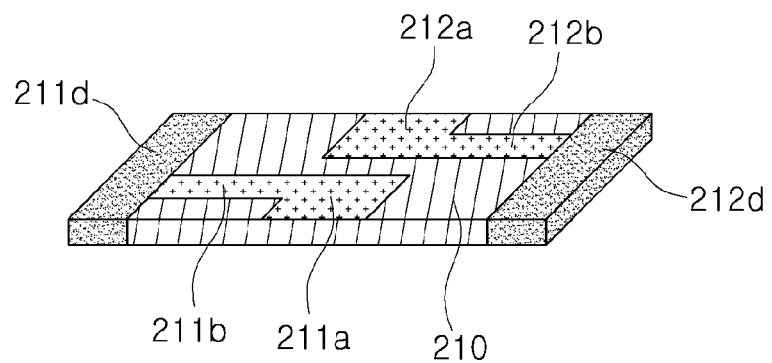
Figure 5C:
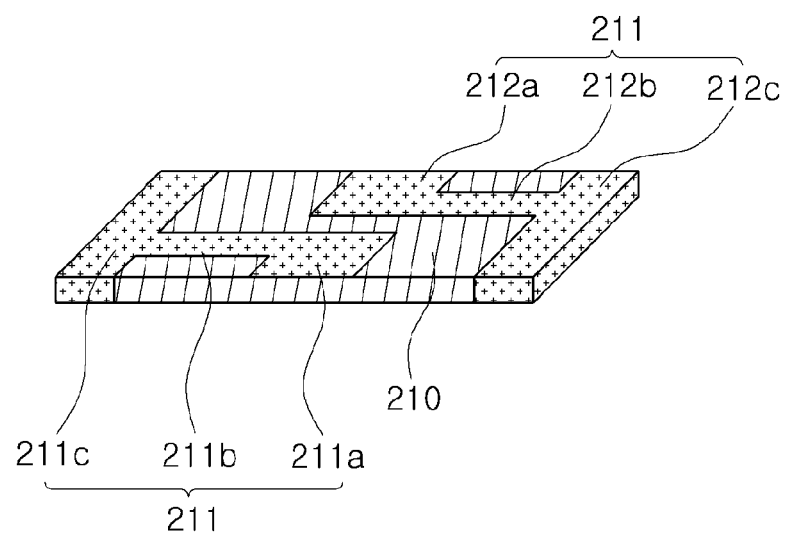

FIGS. 5A through 5C are perspective views illustrating a manufacturing process of the interposer board of the multilayer ceramic electronic component of FIG. 1.

Referring to FIGS. 5A through 5C, in the interposer board 200 included in the multilayer ceramic electronic component according to the present disclosure, the insulation board 210 is cut at a predetermined size, and the first and second connection terminals 211 and 212 are formed on the insulation board 210.

In the first and second connection terminals 211 and 212, first and second connection parts 211a and 212a for contacting the first and second external electrodes 131 and 132 are formed by applying a conductive resin paste to inner sides of the insulation board 210, and the first and second connection parts 211a and 212a are extended to both end portions of the insulation board 210 to thereby form first and second interconnection parts 211b and 212b.

In this case, first and second terminal parts 211c and 212c may include a conductive conduction layer formed by applying a conductive paste on a surface of the insulation board 210 and a conductive resin layer formed to cover the conductive conduction layer.

Then, the first and second terminal parts 211c and 212c are formed to cover both end portions of the insulation board 210.

Thereafter, if necessary, first and second plating layers 211d and 212d may be formed on the first and second terminal parts 211c and 212c by performing nickel plating and gold plating.

In this case, since the multilayer ceramic capacitor 100 is attached to the interposer board 200 after the interposer board 200 is manufactured, the multilayer ceramic capacitor 100 is not immersed into a plating solution at the time of plating the connection terminal of the interposer board 200.

Upper surfaces of the first and second connection parts 211a and 212a of the interposer board 200 may be provided with first and second conductive adhesive layers 220 and 230 so as to contact and adhere to the mounting surface of the first and second external electrodes 131 and 132 of the multilayer ceramic capacitor 100. In this case, the first and second conductive adhesive layers 220 and 230 may be electrodes formed of a conductive resin or a high melting point solder.

Therefore, the multilayer ceramic capacitor 100 and the interposer board 200 may be mechanically coupled to each other while being electrically connected to each other by the first and second conductive adhesive layers 220 and 230 as described above.

The interposer board 200 may serve to alleviate stress or vibration caused by piezoelectric properties of the multilayer ceramic capacitor 100 through elastic force of the insulation board 210, decreasing an intensity of acoustic noise generated in the board.

Meanwhile, the insulation board 210 configuring the interposer board 200 may be formed to have an area smaller than that of the mounting surface of the multilayer ceramic capacitor 100. That is, a width W2 of the insulation board 210 may be narrower than a width W1 of the ceramic body 110.

The interposer board 200 may have an area smaller than that of the mounting surface of the multilayer ceramic capacitor 110 as described above, such that an area of a region of the insulation board 210 and a mounting board to which the stress of the multilayer ceramic capacitor 100 is transferred is decreased. Therefore, the intensity of the acoustic noise may be further decreased.

In addition, since the interposer board 200 absorbs mechanical stress from the outside and bending of the mounting board, occurrence of cracks, or the like, in the multilayer ceramic capacitor 100 may be decreased.

Board Having Multilayer Ceramic Electronic Component Mounted Thereon

Figure 6:
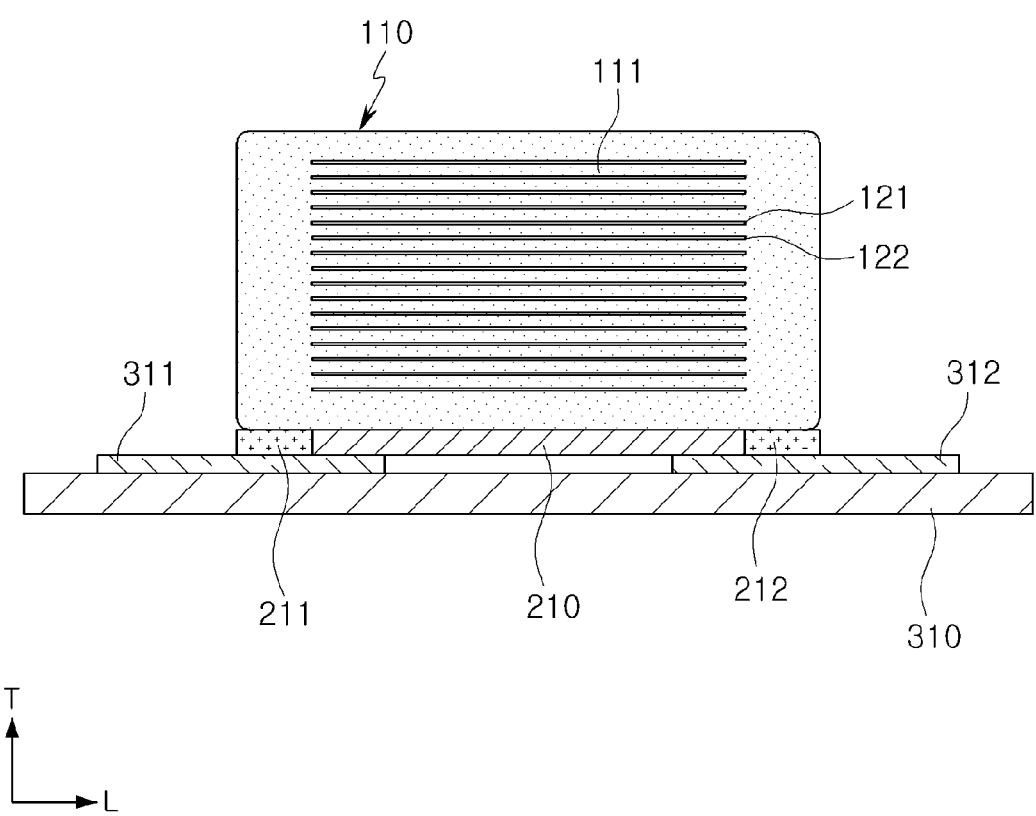
FIG. 6 is a cross-sectional view illustrating a form in which the multilayer ceramic electronic component of FIG. 1 is mounted on a board taken in a length direction.

FIG. 6 is a cross-sectional view illustrating a form in which the multilayer ceramic electronic component of FIG. 1 is mounted on a board taken in a length direction.

Referring to FIG. 6, the board having a multilayer ceramic electronic component mounted thereon according to an exemplary embodiment of the present disclosure may include a board 310 on which the multilayer ceramic electronic component is horizontally mounted and first and second electrode pads 311 and 312 formed on the board 310 to be spaced apart from each other.

In this case, the multilayer ceramic electronic component may be electrically connected to the board 310 in a state in which the interposer board 200 is disposed below, and the first and second terminal parts 211c and 212c of the first and second connection terminals 211 and 212 are positioned on and attached to the first and second electrode pads 311 and 312, so as to contact each other.

When voltage is applied in a state in which the multilayer ceramic electronic component is mounted on the circuit board 310 as described above, acoustic noise may be generated.

In this case, sizes of the first and second electrode pads 311 and 312 may become an indicator for determining an amount of solder connecting the first and second external electrodes 131 and 132 of the multilayer ceramic capacitor 100, the first and second connection terminals 211 and 212 of the interposer board 200, and the first and second electrode pads 311 and 312 to each other, and the intensity of the acoustic noise may be adjusted according to the amount of the solder.

As set forth above, according to exemplary embodiments of the present disclosure, stress or vibration caused by piezoelectric properties of the multilayer ceramic capacitor may be alleviated by elastic force of the interposer board, such that the intensity of the acoustic noise generated in the circuit board is decreased.

In addition, since the plating is not performed on the surface of the external electrode of the multilayer ceramic capacitor, even though the amount of the solder is increased at the time of mounting the multilayer ceramic capacitor on the circuit board, a problem in which the solder rises up along the external electrode of the multilayer ceramic capacitor may be prevented, thereby blocking piezoelectric stress from being directly transferred from the multilayer ceramic capacitor to the board through the external electrode. Therefore, acoustic noise may be further decreased.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic electronic component comprising:
a multilayer ceramic capacitor including:
a ceramic body in which a plurality of dielectric layers are stacked,
a plurality of first and second internal electrodes alternately exposed to first and second side surfaces of the ceramic body, having the dielectric layers interposed therebetween, and
first and second external electrodes extended from the first and second side surfaces of the ceramic body to portions of a mounting surface of the ceramic body and connected to the first and second internal electrodes, respectively; and
an interposer board including:
an insulation board coupled to the mounting surface of the multilayer ceramic capacitor, and
first and second connection terminals disposed on the insulation board and connected to the first and second external electrodes, respectively,
wherein the interposer board is formed to have an area smaller than that of the mounting surface of the multilayer ceramic capacitor,
wherein the first and second connection terminals of the interposer board include:
first and second terminal parts formed to cover both end portions of the insulation board in a length direction;
first and second interconnection parts extended inwardly from the first and second terminal parts along an upper surface of the insulation board; and
first and second connection parts formed at a position corresponding to the first and second external electrodes in the center of the insulation board in the length direction and connected to end portions of the first and second interconnection parts and connected to the first and second external electrodes, respectively,
wherein the first and second external electrodes are formed on central portions of both side surfaces of the ceramic body.

2. The multilayer ceramic electronic component of claim 1, wherein the first and second terminal parts of the first and second connection terminals include:
a conductive conduction layer disposed on a surface of the insulation board; and
a conductive resin layer disposed to cover the conductive conduction layer.

3. The multilayer ceramic electronic component of claim 1, wherein the first and second connection terminals include a conductive adhesive layer disposed on the first and second connection parts.

4. The multilayer ceramic electronic component of claim 3, wherein the conductive adhesive layer contains a conductive resin.

5. The multilayer ceramic electronic component of claim 3, wherein the conductive adhesive layer comprises a high melting point solder.

6. The multilayer ceramic electronic component of claim 1, wherein the first and second connection terminals include a plating layer formed on the first and second terminal parts.

7. The multilayer ceramic electronic component of claim 6, wherein in the plating layer of the first and second terminal parts, a nickel plating layer and a gold plating layer are sequentially formed.

8. The multilayer ceramic electronic component of claim 1, wherein the multilayer ceramic capacitor includes a plating layer disposed on the first and second external electrodes.

9. The multilayer ceramic electronic component of claim 1, wherein in the multilayer ceramic capacitor, the first and second external electrodes are disposed to be extended from both side surfaces of the ceramic body to portions of an upper surface of the ceramic body.

10. The multilayer ceramic electronic component of claim 1, wherein the multilayer ceramic capacitor includes upper and lower cover layers formed on upper and lower surfaces of the ceramic body.

11. The multilayer ceramic electronic component of claim 10, wherein the lower cover layer is formed to be thicker than the upper cover layer.

12. A board having a multilayer ceramic electronic component mounted thereon, comprising:
a board having first and second electrode pads formed thereon; and
a multilayer ceramic electronic component mounted on the board,
wherein the multilayer ceramic electronic component includes:
a multilayer ceramic capacitor including a ceramic body in which a plurality of dielectric layers are stacked, a plurality of first and second internal electrodes formed to be alternately exposed to both side surfaces of the ceramic body, having the dielectric layer interposed therebetween, and first and second external electrodes formed to be extended from both side surfaces of the ceramic body to portions of a mounting surface of the ceramic body and connected to the first and second internal electrodes, respectively; and
an interposer board including an insulation board coupled to the mounting surface of the multilayer ceramic capacitor and first and second connection terminals formed on the insulation board and having an upper surface connected to the first and second external electrodes, respectively, and a lower surface connected to the first and second electrode pads, respectively,
wherein the interposer board is formed to have an area smaller than that of the mounting surface of the multilayer ceramic capacitor,
wherein the first and second connection terminals of the interposer board include:
first and second terminal parts formed to cover both end portions of the insulation board in a length direction;
first and second interconnection parts extended inwardly from the first and second terminal parts along an upper surface of the insulation board; and
first and second connection parts formed at a position corresponding to the first and second external electrodes in the center of the insulation board in the length direction and connected to end portions of the first and second interconnection parts and connected to the first and second external electrodes, respectively,
wherein the first and second external electrodes are formed on central portions of both side surfaces of the ceramic body in a width direction of the ceramic body.

13. The board of claim 12, wherein the first and second terminal parts of the first and second connection terminals include:
a conductive conduction layer formed on a surface of the insulation board; and
a conductive resin layer formed to cover the conductive conduction layer.

14. The board of claim 12, wherein the first and second connection terminals include a conductive adhesive layer formed on the first and second connection parts.

15. The board of claim 14, wherein the conductive adhesive layer contains a conductive resin.

16. The board of claim 14, wherein the conductive adhesive layer is formed of a high melting point solder.

17. The board of claim 12, wherein the first and second connection terminals include a plating layer formed on the first and second terminal parts.

18. The board of claim 17, wherein the plating layer of the first and second terminal parts is configured of a nickel plating layer and a gold plating layer that are sequentially formed.

19. The board of claim 12, wherein the multilayer ceramic capacitor includes a plating layer formed on the first and second external electrodes.

20. The board of claim 12, wherein in the multilayer ceramic capacitor, the first and second external electrodes are formed to be extended from both side surfaces of the ceramic body to portions of an upper surface of the ceramic body.

21. The board of claim 12, wherein the multilayer ceramic capacitor includes upper and lower cover layers formed on upper and lower surfaces of the ceramic body.

22. The board of claim 21, wherein the lower cover layer is formed to be thicker than the upper cover layer.

* * * * *